United States Patent
Gasquet et al.

(10) Patent No.: US 8,897,073 B2
(45) Date of Patent: Nov. 25, 2014

(54) NVM WITH CHARGE PUMP AND METHOD THEREFOR

(75) Inventors: Horacio P. Gasquet, Austin, TX (US); Jeffrey C. Cunningham, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 105 days.

(21) Appl. No.: 13/616,206

(22) Filed: Sep. 14, 2012

(65) Prior Publication Data

US 2014/0078828 A1 Mar. 20, 2014

(51) Int. Cl.
*G11C 16/04* (2006.01)

(52) U.S. Cl.
USPC ............. 365/185.18; 365/185.24; 365/189.09

(58) Field of Classification Search
USPC ............. 365/185.05, 185.18, 185.24, 185.19, 365/189.09, 230.06
See application file for complete search history.

(56) References Cited

U.S. PATENT DOCUMENTS

| | | | |
|---|---|---|---|
| 5,306,954 A * | 4/1994 | Chan et al. ................... | 307/110 |
| 5,589,697 A | 12/1996 | Smayling et al. | |
| 5,635,776 A | 6/1997 | Imi | |
| 5,754,476 A | 5/1998 | Caser et al. | |
| 5,914,632 A | 6/1999 | Fotouhi et al. | |
| 5,994,949 A | 11/1999 | Menichelli | |
| 6,005,810 A * | 12/1999 | Wu ........................ | 365/185.33 |
| 6,118,329 A | 9/2000 | Jin | |
| 6,163,487 A | 12/2000 | Ghilardelli | |
| 6,184,741 B1 | 2/2001 | Ghilardelli et al. | |
| 6,445,623 B1 | 9/2002 | Zhang et al. | |
| 7,427,889 B2 * | 9/2008 | Lin et al. ........................ | 327/536 |
| 7,477,093 B2 | 1/2009 | Al-Shamma et al. | |
| 7,495,500 B2 | 2/2009 | Al-Shamma et al. | |
| 7,511,977 B2 * | 3/2009 | Oyama et al. .................... | 363/62 |
| 8,310,877 B2 * | 11/2012 | Cunningham et al. ... | 365/185.21 |
| 2002/0097621 A1 | 7/2002 | Fujiwara | |
| 2008/0054990 A1 * | 3/2008 | Shieh et al. .................... | 327/536 |
| 2008/0218252 A1 * | 9/2008 | Lin et al. ........................ | 327/541 |

FOREIGN PATENT DOCUMENTS

EP 1262998 A1 12/2002
WO 0215277 A2 2/2002

* cited by examiner

*Primary Examiner* — Gene Auduong
(74) *Attorney, Agent, or Firm* — James L. Clingan, Jr.; Mary Jo Bertani (57) ABSTRACT

A non-volatile memory device comprises an array of memory cells and a charge pump coupled to the memory cells. The charge pump is dynamically reconfigurable to operate in a bypass mode to provide a first voltage to the memory cells, a program mode to provide the first voltage to the memory cells, and an erase mode to provide a second voltage that has inverse polarity of the first voltage.

14 Claims, 6 Drawing Sheets

NVM WITH CHARGE PUMP AND METHOD THEREFOR

BACKGROUND

1. Field

This disclosure relates generally to non-volatile memories (NVMs), and more specifically, to use of charge pumps in NVMs.

2. Related Art

Scaling is generally expected for semiconductors which results in the ability to provide more functionality for a given size of a semiconductor device as well as reduced power for a given functionality. The scaling relates to reduced dimensions for given features such as gate dimensions and layer thicknesses. As these dimensions are reduced, breakdown voltages become more of an issue which has resulted in, for example, reduced power supply voltages. Thus, breakdown voltage issues can be a limiter for dimension reductions. In the case of non-volatile memories (NVMs), sufficient voltages for programming and erase are required and such voltages may not reduce at the same rate as the ability to otherwise reduce the dimensions. Thus, scaling of NVMs has generally been slower than scaling for general purpose transistors.

Thus, there is a need to provide further scaling in NVMs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

Shown in FIG. 4 is a mode of the exemplary charge pump of FIG. 2 during a portion of the method of FIG. 3.

DETAILED DESCRIPTION

A system includes as a non-volatile memory (NVM) that is erased by applying a negative voltage relative to ground applied to a control gate of the NVM. This has the effect of driving electrons out of a charge storage layer under the control gate. During programming a voltage greater than a positive power supply voltage is provided by a charge pump. The same charge pump is also used in generating the negative voltage that is applied to the control gate of the NVM during erasing. This is particular beneficial when the NVM cells utilize nanocrystals in which the dielectric layer between the control gate and the nanocrystals has a thickness less than a largest diameter of the nanocrystals. This is better understood by reference to the drawings and the following written description.

Figure 1:
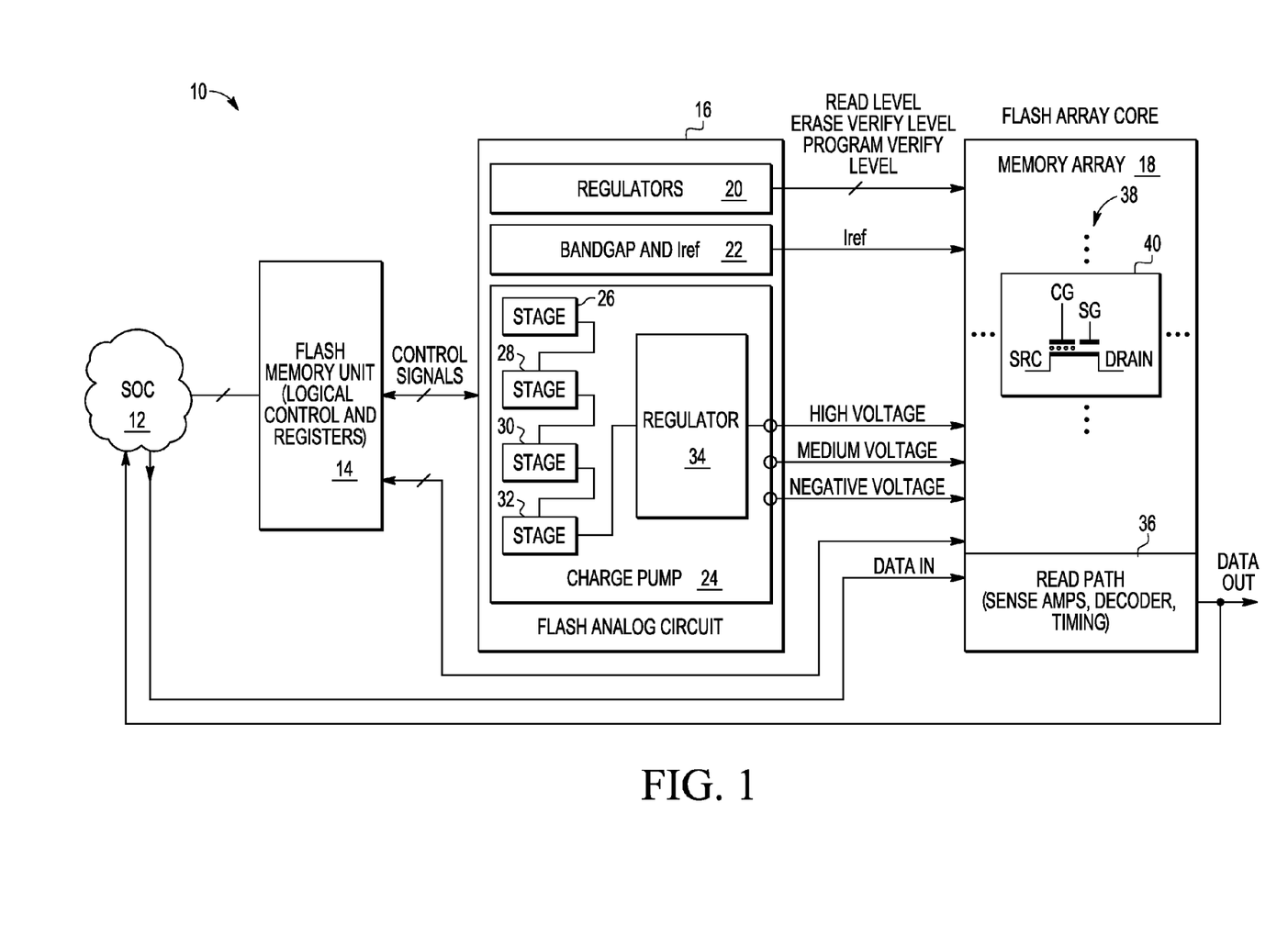
FIG. 1 is a block diagram of a system having a non-volatile memory (NVM) according to an embodiment.

Shown in FIG. 1 is a system including a system on a chip (SOC) circuit coupled to a flash memory unit 14 that provides logic control and registers, a flash analog block 16 coupled to flash memory unit 14, and a flash array core 18 coupled to flash analog block 16, flash memory unit 14, and SOC circuit 12. Regulation block 16 includes regulators 20, bandgap and current reference Iref 22, and a voltage pump 24. Voltage pump 24 includes stages 26, 28, 30, and 32 and regulator 34. Stages 26, 28, 30, and 32 are shown as being serially connected but other configurations may be implemented as needed. Regulators 20 provide read level, erase verify level, and program verify levels to flash array core. Bandgap and current reference Iref 22 provides current reference Iref to flash array core 18. Voltage pump 24 provides one or more of a high voltage, a medium voltage, and a negative voltage to flash array core 18. Flash array core 18 includes a memory array 38 having a plurality of memory cells, which includes an exemplary memory cell 40, and a read path 36 that is the portion that is coupled to SOC 12. Each memory cell such as memory cell 40 includes a control gate CG over a plurality of nanocrystals 106, a source SRC, a drain, and a select gate SG. Flash memory unit 14 controls flash array core 18 including programming, erasing, and reading.

Figure 2:
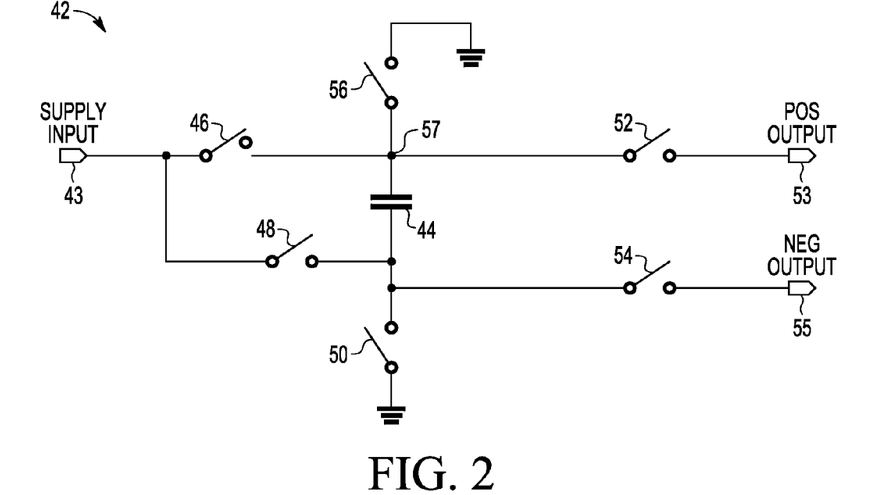
FIG. 2 is a circuit diagram of an exemplary charge pump used in portions of the NVM of FIG. 1.

Shown in FIG. 2 is a pump cell 42 that is exemplary in most respects of pump cells placed in series, parallel, and/or a combination of series and parallel in stages 26, 28, 30, and 32. Pump cell 42 includes a capacitor 44 and switches 46, 48, 50, 52, 54, and 56. Switch 46 has a first terminal connected to a supply input 43 and a second terminal. Switch 48 has a first terminal connected to supply input 43 and a second terminal. Capacitor 44 has a first terminal connected to the second terminal of switch 46 and a second terminal connected to the second terminal of switch 48. Switch 50 has a first terminal connected to the second terminal of capacitor 44. Switch 52 has a first terminal connected to the first terminal of capacitor 44 and a second terminal connected to a positive output terminal 53. Switch 54 has a first terminal connected to the second terminal of capacitor 44 and a second terminal coupled to a negative output terminal 55. Switches 54 and 56 and negative output 55 may not be present in the pump cells of stages 26, 28, and 30. The last pump state 32 receives control signals as described herein to enable polarity inversion and negative output 55. Pump cell 42 is used for providing a voltage with a higher magnitude than that supplied at supply input 43. Capacitor 44 is may be referenced as a stability capacitor and is relatively large in area compared to much of the circuitry of charge pump 24. For example, the sum of the areas of the stability capacitors of stages 26, 28, 30, and 32 may be more than half of the total area of charge pump 24.

Figure 3:
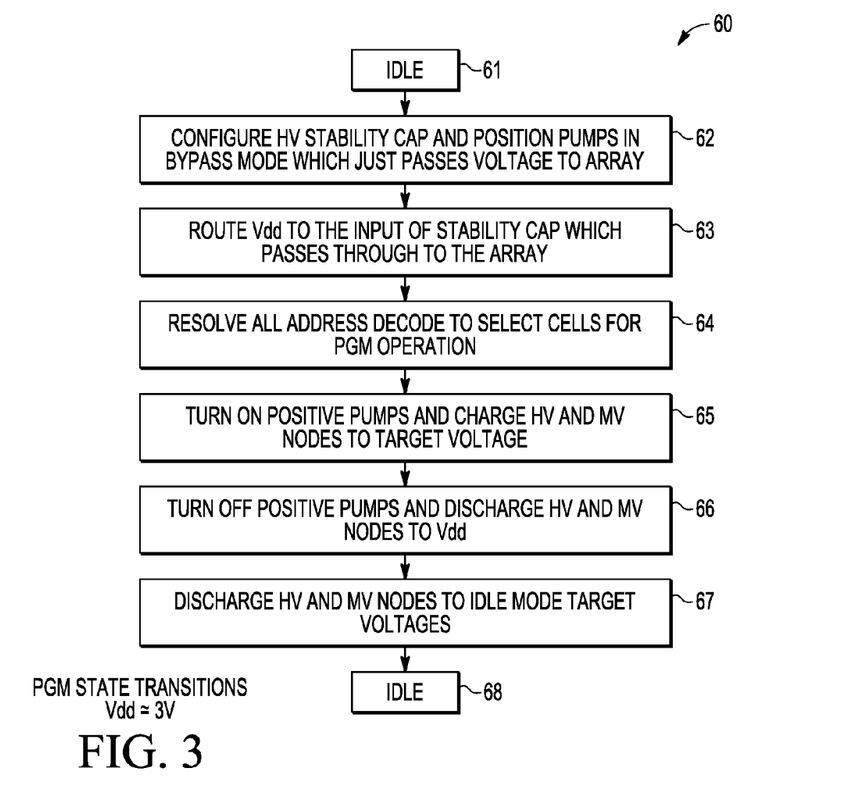
FIG. 3 is a flow diagram of a programming method of the system of FIG. 1.
Figure 5:
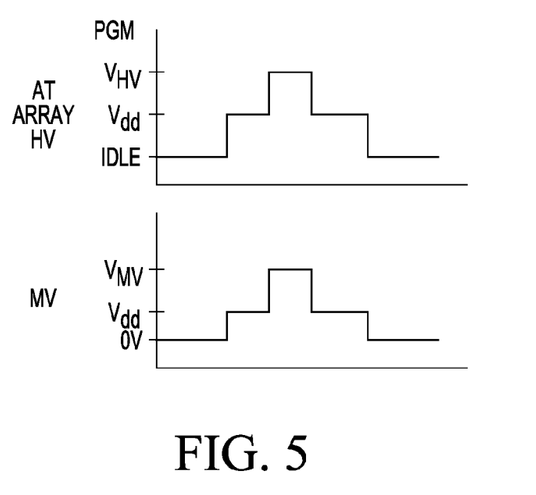
FIG. 5 is a chart showing two signals during the programming method.

Shown in FIG. 3 is a programming method 60 having steps 61, 62, 63, 64, 65, 66, 67, and 68. Step 61 is an idle step which is a stable state in which no program, erase, or read is occurring. Voltage pump 24, in step 62, is configured to simply pass the power supply voltage, which may be present at supply input 43 as the positive output at node 53 for all pump cells. In step 63, the power supply voltage, which may be referenced as VDD, is passed to memory array 38 by closing switch 46, 50 and 52, and by opening switches 48 and 56 in each pump cell 42 composing charge pump stages 26,28,30, and 32. In step 64, all address decode is performed to identify which cells are to be programmed. At step 65, the stages of stages 26, 28, 30, and 32 needed to provide the programming voltages are activated which may also be called turned on. This results in the generation of voltages HV and MV as shown in FIG. 5. Voltage HV is applied at the control gate and voltage MV is applied at the source SRC for each cell to be programmed. After the pulses of HV and MV are generated as shown in FIG. 5, and applied to the memory cells selected for programming, in step 56 stages 26, 28, 30, and 32 are turned off and the discharge of MV and HV commences as shown as the first reduction from the peak of MV and HV as shown in FIG. 5. In step 67, the discharge of HV and MV is completed so that HV and MV return to the level at idle of step 51. At this point, idle at step 68 can be achieved.

Figure 4:
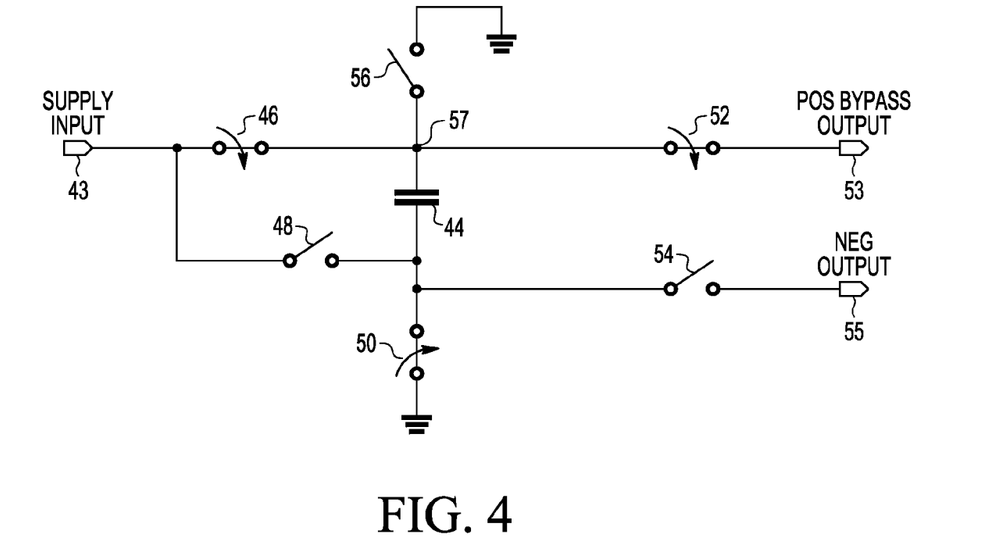

The operation of exemplary pump cell 42 is shown in FIG. 4 for the case of step 65 when the pumps are active. Switches 56 and 54 are open during step 65. Switches 46 and 48 are alternately opened and closed. Switch 50 is closed when switch 46 is closed and open when switch 48 is closed. Switch 52 is open when switch 46 is closed and closed when switch 48 is closed. This is common charge pump operation for a pump cell as a stage in a charge pump.

Figure 6:
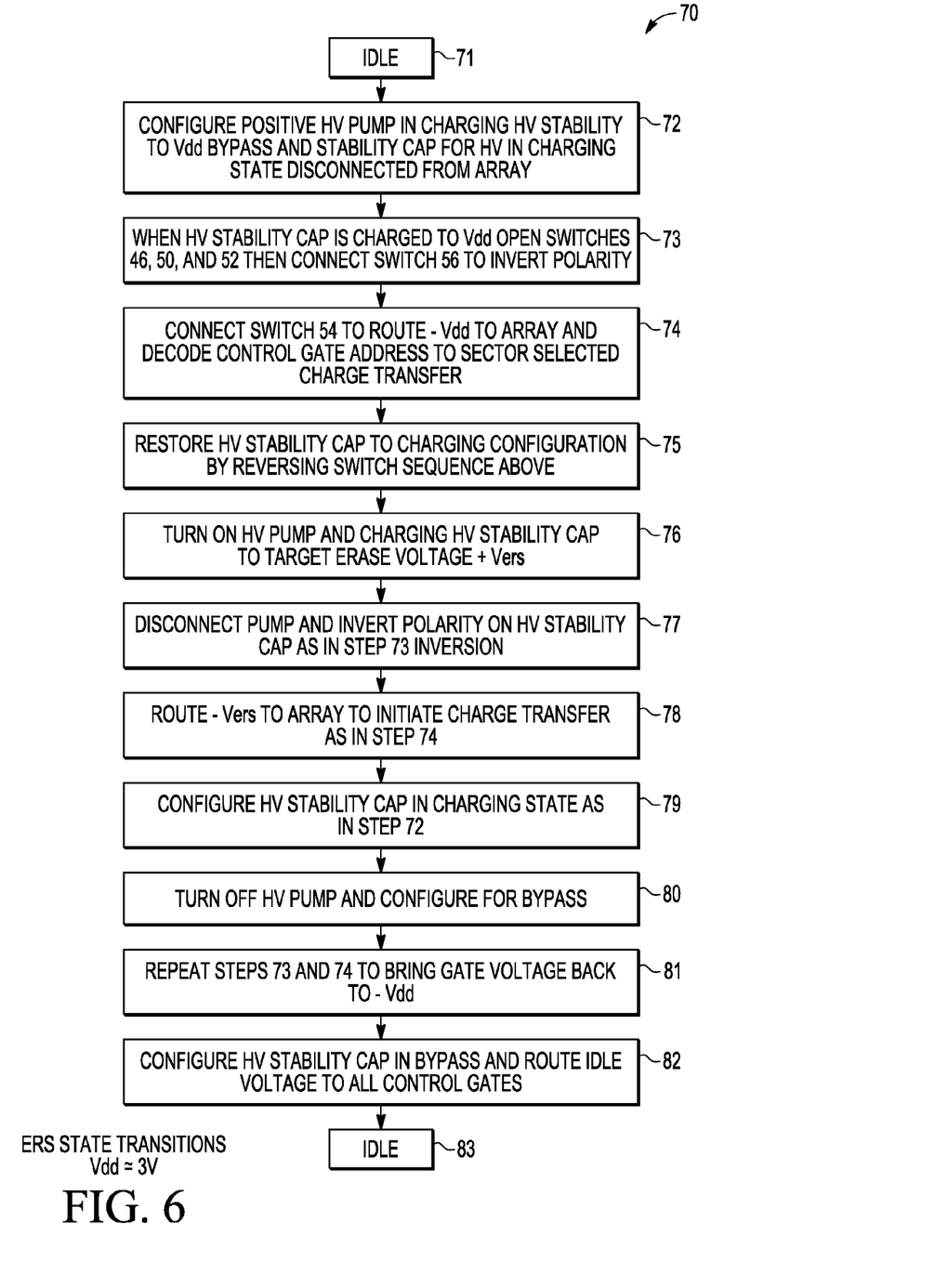
FIG. 6 is a flow diagram of an erasing method of the system of FIG. 1.
Figure 7:
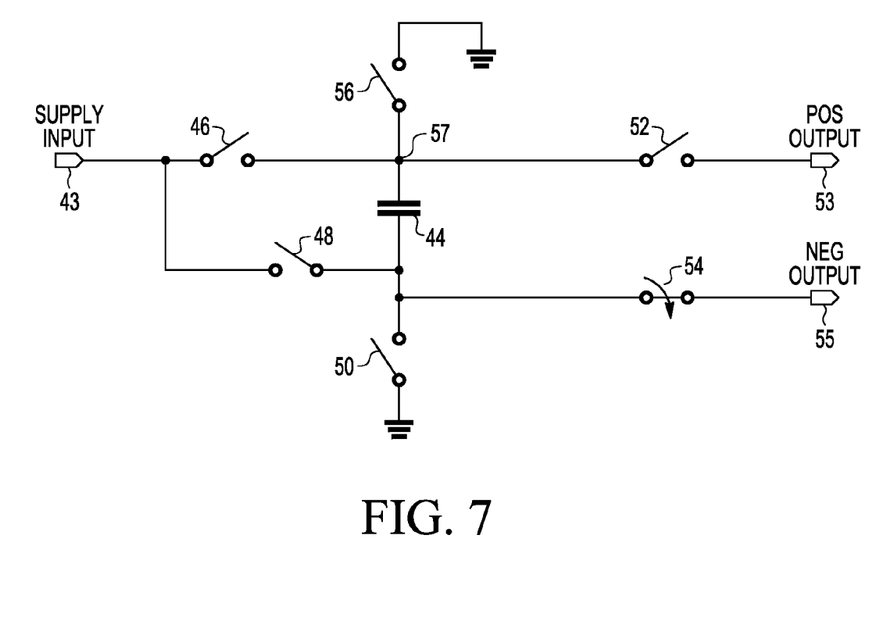
FIG. 7 is a mode of the exemplary charge pump of FIG. 2 during a portion of the method of FIG. 6.
Figure 8:
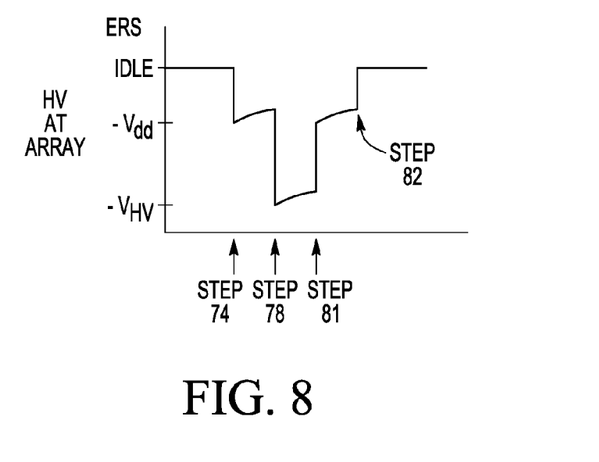
FIG. 8 is a chart showing a signal during the erasing method.

Shown in FIG. 6 is an erasing method 70 having steps 71, 72, 73, 74, 75, 76, 77, 78, 79, 80, 81, 82, and 83. Shown in FIG. 7 is exemplary pump cell 42 for use in erasing. Step 71 is an idle step as steps 61 and 68 in which no program, erase, or read is occurring. Step 72 establishes VDD at node 57 by closing switch 46, 50 and 52, and by opening switches 48 and 56 in each pump cell 42 composing charge pump stages 26,28,30. However switch 52 is kept open in pump stage 32 to avoid passing positive voltage to the memory array 38. In step 73, switches 46, 50, and 52 are opened and in the last stage only, which is stage 32, switches 54 and 56 are closed. With all switches open except switches 56 and 54, the output at negative output terminal 55 is the opposite polarity from that provided at positive output terminal 53 and of substantially the same magnitude and is thus about −VDD. This negative voltage at terminal 55 is then coupled to array 38 and decoded by address to the sector location for the memory cells 40 targeted for erase. This is shown in FIG. 8 at step 74. The negative voltage will rise some after being coupled to array 38. After supplying the negative voltage to array 38, at step 75, stability capacitor 44 in last stage 32 is returned to its charging state at step 75 by switches 50 and 46 being closed and the remaining switches being opened. In this case capacitor 44 is charged to VDD. Capacitor 44, at step 76 is then charged to a higher voltage than VDD by turning on the high voltage pumping causing switches 46 and 50 to be opened and switch 48 to be closed. The open and closed conditions of switches can be alternated until the desired voltage across capacitor 44 is attained in last pump stage 32 up to twice the voltage supplied at supply input 43 of each charge pump stage connected in series. At step 77, the stability capacitors 44 in the pump cells for the last charge pumping stage 32 are disconnected by configuring switches 46 and 48 to be open and the capacitor voltage is inverted by switch 50 being opened and switches 54 and 56 being closed. Terminal 55 then has the target erase voltage which is a negative voltage. In one embodiment during step 77, pump stages 26, 28, 30 may be operating as a charge pump maintaining the input voltage 43 for pump cells used in pump stage 32, and this voltage could be regulated. In step 78 the negative voltage output, at the target erase magnitude, is then coupled to array 38 for use in erasing. This negative voltage at the target magnitude is shown in FIG. 8 at step 78. At step 79, switches 54 and 56 are opened and switches 46 and 50 are closed in the last pump stage 32. At step 80 the pumping is turned off in all stages as in step 72. At step 81, then steps 73 and 74 are repeated by then opening switches 46 and 50 and closing switches 54 and 56 to provide −VDD at negative output terminal 55. As shown in FIG. 8, this shows that the erase signal is supplied at −VDD at step 81. This continues as part of the erase pulse, and at step 82 the address decode is de-asserted so that idle voltages are sent to array 38 and all cells, such as cell 40, are unselected. Step 83 returns the charge pump 24 to the idle configuration.

Figure 9:
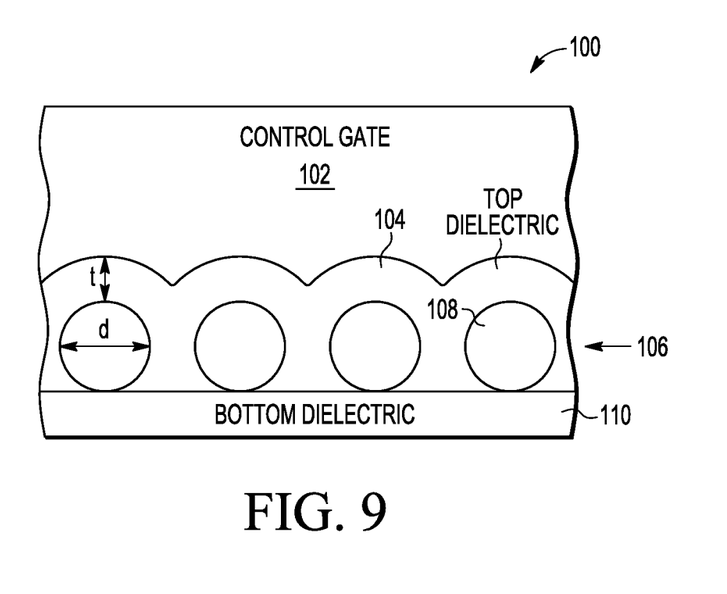
FIG. 9 is a cross section of a portion of an NVM memory cell that may be used in the NVM of FIG. 1.

Shown in FIG. 9 is portion 100 of an exemplary memory cell which may be memory cell 40. This shows a control gate 102, a dielectric layer 104 under control gate 102, nanocrystals 106 in dielectric layer 104 and over a bottom dielectric layer 110. Nanocrystal 108 is an exemplary nanocrystal of nanocrystals 106. Nanocrystals 106 have diameters that may differ but shown is an exemplary diameter d have a distance t from a top surface of dielectric 104. For an erase as described herein, a negative voltage is applied to control gate in the form of the negative pulse of FIG. 8 that drives electrons out of nanocrystals 106 and thus erases the memory cell. This type of erasing is more efficient than applying a positive voltage to the control gate to erase when the diameter d is greater than the thickness t of dielectric 104 above the nanocrystal. Therefore, a lower voltage can be used to achieve an equivalent erase speed, resulting in lower power operation, a smaller charge pump 24, and lower breakdown requirements for many of the transistors involved in erasing. In a conventional NVM implementation in which hot carrier injection is available for programming, the voltages for programming are generally lower than required for erase. Thus, the reduction in the erase voltage enables the charge pump reuse to supply both positive and negative voltages with minimal area penalty. In particular the stability capacitors in stage 32 are reused in that the same capacitors used for generating the high positive voltages in the last pump stage are the same ones used in generating the negative voltage.

By now it should be appreciated that there has been provided a method of operating a non-volatile memory device that includes configuring a charge pump coupled to the non-volatile memory device to generate a first voltage of a first polarity during a program operation and a second voltage of a second polarity during an erase operation, wherein a magnitude of the second voltage is less than or equal to a magnitude of the first voltage. The method may have further characterization by which the non-volatile memory device includes a plurality of memory cells, and each of the memory cells may include a bottom dielectric layer, a plurality of thin film storage (TFS) charge storage elements disposed on the bottom dielectric layer, and a top dielectric layer formed over the charge storage elements, wherein a thickness of the top dielectric layer is less than a diameter of the TFS charge storage elements. The method may further include configuring the charge pump to output the first voltage in a bypass mode during a stability capacitor charging state, wherein a stability capacitor is part of the charge pump and the charge pump is connected to the memory cells during the capacitor charging state. The method may further include, when a stability capacitor in the charge pump is charged to the first voltage, configuring the charge pump to invert the first polarity of the first voltage to the second polarity of the second voltage. The method may further include configuring the charge pump to route the second voltage to a subset of the memory cells. The method may further include, during the erase operation configuring the charge pump to output the second voltage during a stability capacitor charging state, wherein a stability capacitor is part of the charge pump and the charge pump is not connected to the memory cells during the capacitor charging state. The method may further include operating a plurality of switches in the charge pump in a first configuration for the program operation and in a second configuration for the erase operation. The method may further include operating the plurality of switches in the charge pump in a third configuration for a bypass mode in which the first voltage is provided to at least some of the memory cells in the non-volatile memory device. The method may have a further characterization by which, during the program operation, a plurality of pump stages in the charge pump are operated to provide a medium voltage to a source electrode of the memory cells and the first voltage to a control gate of the memory cells.

Disclosed also a non-volatile memory device that includes a plurality of memory cells wherein each of the memory cells includes a bottom dielectric layer, a plurality of thin film storage (TFS) charge storage elements disposed on the bottom dielectric layer, and a top dielectric layer formed over the charge storage elements, wherein a thickness of the top dielectric layer is less than a diameter of the charge storage elements. The non-volatile memory device further includes a charge pump coupled to the memory cells, wherein the charge pump generates a first voltage of a first polarity during a program operation and a second voltage of a second polarity during an erase operation, and a magnitude of the second voltage is less than or equal to a magnitude of the first voltage. The non-volatile memory device has a further characterization by which the charge pump includes a plurality of charge pump cells, wherein each charge pump cell includes a stability capacitor and a first switch coupled in parallel on one side of the stability capacitor and a second switch coupled in parallel on another side of the stability capacitor, the first and second switches are closed during the program operation to conduct the first voltage to the memory cells. The non-volatile memory device has a further characterization by which each of the charge pump cells further includes a third switch coupled in series between ground and the stability capacitor and a fourth switch coupled in series between ground and the stability capacitor, wherein during the program operation the third switch is open and a fifth switch is based on a clocked signal, wherein the fifth switch is coupled between a supply voltage and a negative terminal of the stability capacitor, and during a portion of the erase operation the first and third switches operate based on a control signal and the fourth switch is open. The non-volatile memory device has a further characterization by which the third switch is operated opposite the first switch during the erase operation. The non-volatile memory device has a further characterization by which each of the charge pump cells further includes a sixth switch coupled in parallel to the stability capacitor, the second switch is open, and the sixth switch is closed to conduct the second voltage to the memory cells during the erase operation. The non-volatile memory device has a further characterization by which during the program operation the fourth and fifth switches operate based on a clocked signal. The non-volatile memory device has a further characterization by which the sixth switch is operated opposite the fourth switch during the program operation.

Also disclosed is a non-volatile memory device that includes an array of memory cells and a charge pump coupled to the memory cells, wherein the charge pump is dynamically reconfigurable to operate in a bypass mode to provide a first voltage to the memory cells, a program mode to provide the first voltage to the memory cells, and an erase mode to provide a second voltage that has inverse polarity of the first voltage. The non-volatile memory device may have a further characterization by which the charge pump includes a plurality of charge pump stages that successively increase a supply voltage to a medium voltage and the first voltage. The non-volatile memory device may have a further characterization by which a magnitude of the first voltage is less than or equal to a magnitude of the second voltage. The non-volatile memory device may have a further characterization by which the memory cells are thin film storage memory cells and the medium voltage is provided to a source electrode of at least some of the memory cells and the first voltage is provided to a control gate of the at least some of the memory cells during the program mode.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. For example, a single capacitor was shown for each pump cell, but a capacitance for use a stability capacitor, for example, may be from multiple capacitors combined to achieve a desired capacitance. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of operating a non-volatile memory device, comprising:
    configuring a charge pump coupled to the non-volatile memory device to generate a first voltage of a first polarity during a program operation and a second voltage of a second polarity during an erase operation, wherein a magnitude of the second voltage is less than or equal to a magnitude of the first voltage; and
    configuring the charge pump to output the first voltage in a bypass mode during a stability capacitor charging state, wherein a stability capacitor is part of the charge pump and the charge pump is connected to the memory cells during the capacitor charging state.

2. The method of claim 1, wherein the non-volatile memory device includes a plurality of memory cells, and each of the memory cells include:
    a bottom dielectric layer;
    a plurality of thin film storage (TFS) charge storage elements disposed on the bottom dielectric layer; and a top dielectric layer formed over the charge storage elements, wherein a thickness of the top dielectric layer is less than a diameter of the TFS charge storage elements.

3. The method of claim 1, further comprising:
when a stability capacitor in the charge pump is charged to the first voltage, configuring the charge pump to invert the first polarity of the first voltage to the second polarity of the second voltage.

4. The method of claim 3, further comprising:
configuring the charge pump to route the second voltage to a subset of the memory cells.

5. The method of claim 1, further comprising:
during the erase operation configuring the charge pump to output the second voltage during a stability capacitor charging state, wherein a stability capacitor is part of the charge pump and the charge pump is not connected to the memory cells during the capacitor charging state.

6. The method of claim 1, further comprising:
operating a plurality of switches in the charge pump in a first configuration for the program operation and in a second configuration for the erase operation.

7. The method of claim 1, further comprising:
operating the plurality of switches in the charge pump in a third configuration for a bypass mode in which the first voltage is provided to at least some of the memory cells in the non-volatile memory device.

8. The method of claim 2, wherein during the program operation, a plurality of pump stages in the charge pump are operated to provide a medium voltage to a source electrode of the memory cells and the first voltage to a control gate of the memory cells.

9. A method of operating a non-volatile memory device, comprising:
configuring a charge pump coupled to the non-volatile memory device to generate a first voltage of a first polarity during a program operation and a second voltage of a second polarity during an erase operation, wherein a magnitude of the second voltage is less than or equal to a magnitude of the first voltage; and
operating the plurality of switches in the charge pump in a third configuration for a bypass mode in which the first voltage is provided to at least some of the memory cells in the non-volatile memory device.

10. The method of claim 9, wherein the non-volatile memory device includes a plurality of memory cells, and each of the memory cells include:
a bottom dielectric layer;
a plurality of thin film storage (TFS) charge storage elements disposed on the bottom dielectric layer; and
a top dielectric layer formed over the charge storage elements, wherein a thickness of the top dielectric layer is less than a diameter of the TFS charge storage elements.

11. The method of claim 9, further comprising:
when a stability capacitor in the charge pump is charged to the first voltage, configuring the charge pump to invert the first polarity of the first voltage to the second polarity of the second voltage.

12. The method of claim 11, further comprising:
configuring the charge pump to route the second voltage to a subset of the memory cells.

13. The method of claim 9, further comprising:
during the erase operation configuring the charge pump to output the second voltage during a stability capacitor charging state, wherein a stability capacitor is part of the charge pump and the charge pump is not connected to the memory cells during the capacitor charging state.

14. The method of claim 9, further comprising:
operating a plurality of switches in the charge pump in a first configuration for the program operation and in a second configuration for the erase operation.

* * * * *